US012696767B2

(12) United States Patent
Nishihara

(10) Patent No.: US 12,696,767 B2
(45) Date of Patent: Jul. 28, 2026

(54) SEMICONDUCTOR DEVICE

(71) Applicant: Sumitomo Electric Device Innovations, Inc., Yokohama (JP)

(72) Inventor: Makoto Nishihara, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 375 days.

(21) Appl. No.: 18/244,443

(22) Filed: Sep. 11, 2023

(65) Prior Publication Data

US 2024/0145413 A1 May 2, 2024

(30) Foreign Application Priority Data

Oct. 26, 2022 (JP) .................................. 2022-171600

(51) Int. Cl.
*H10W 44/20* (2026.01)
*H10D 84/05* (2025.01)
(Continued)

(52) U.S. Cl.
CPC ............ *H10W 44/20* (2026.01); *H10D 84/05* (2025.01); *H10D 88/00* (2025.01); *H10W 70/475* (2026.01); *H10W 72/537* (2026.01); *H10W 90/00* (2026.01); *H10W 44/234* (2026.01); *H10W 72/07352* (2026.01); *H10W 72/07354* (2026.01); *H10W 72/07553* (2026.01); *H10W 72/07554* (2026.01); *H10W 72/327* (2026.01); *H10W 72/347* (2026.01); *H10W 72/5445* (2026.01); *H10W 72/5453* (2026.01);
(Continued)

(58) Field of Classification Search
CPC ............ H10W 44/206; H10W 44/209; H10W 44/241; H10W 44/601; H10W 70/481;

H10W 72/851; H10W 40/778; H10W 76/134; H10W 20/20; H10W 20/40; H01L 23/047; H01L 23/4334; H01L 23/642; H01L 23/481; H01L 23/482; H01L 25/16
See application file for complete search history.

(56) References Cited

U.S. PATENT DOCUMENTS

| 2012/0068306 | A1* | 3/2012 | Song | ..................... | H10W 72/00 |
| | | | | | 257/532 |
| 2015/0116040 | A1* | 4/2015 | Miwa | ........................ | H03F 1/56 |
| | | | | | 330/307 |
| 2023/0023489 | A1* | 1/2023 | Srowig | ................. | G01S 7/4815 |

FOREIGN PATENT DOCUMENTS

JP 2012-038837 A 2/2012

* cited by examiner

*Primary Examiner* — Steven B Gauthier
*Assistant Examiner* — Marc-Anthony Armand
(74) *Attorney, Agent, or Firm* — Volpe Koenig

(57) ABSTRACT

A semiconductor device includes a semiconductor chip including a substrate, a transistor provided on an upper surface of the substrate and having an input electrode to which a high frequency signal is input, an output electrode from which the high frequency signal is output, and a reference potential electrode to which a reference potential is supplied, and a metal pattern provided on the upper surface of the substrate and electrically connected to the reference potential electrode, a first capacitor including a first lower electrode provided on the metal pattern and electrically connected to the metal pattern, a first dielectric layer provided on the first lower electrode, and a first upper electrode provided on the first dielectric layer, and a first bonding wire electrically connecting the first upper electrode and a first electrode which is any one of the input electrode and the output electrode.

8 Claims, 18 Drawing Sheets

(51) Int. Cl.

| | |
|---|---|
| *H10D 88/00* | (2026.01) |
| *H10W 70/40* | (2026.01) |
| *H10W 72/00* | (2026.01) |
| *H10W 72/30* | (2026.01) |
| *H10W 72/50* | (2026.01) |
| *H10W 72/90* | (2026.01) |
| *H10W 90/00* | (2026.01) |

(52) U.S. Cl.
CPC ...... *H10W 72/547* (2026.01); *H10W 72/5473* (2026.01); *H10W 72/5475* (2026.01); *H10W 72/5522* (2026.01); *H10W 72/865* (2026.01); *H10W 72/884* (2026.01); *H10W 72/921* (2026.01); *H10W 72/926* (2026.01); *H10W 72/932* (2026.01); *H10W 72/934* (2026.01); *H10W 72/944* (2026.01); *H10W 72/952* (2026.01); *H10W 90/736* (2026.01); *H10W 90/738* (2026.01); *H10W 90/755* (2026.01); *H10W 90/758* (2026.01); *H10W 90/759* (2026.01)

SEMICONDUCTOR DEVICE

CROSS REFERENCE TO RELATED APPLICATIONS

This application claims priority based on Japanese Patent Application No. 2022-171600 filed on Oct. 26, 2022, and the entire contents of the Japanese patent applications are incorporated herein by reference.

FIELD

The present disclosure relates to a semiconductor device.

BACKGROUND

It is known that a semiconductor chip in which a transistor is provided and matching circuit elements for impedance matching are mounted on a base, and the transistor and the matching circuit elements are electrically connected by using bonding wires (for example, Patent Document 1: Japanese Patent Application Laid-Open No. 2012-38837).

SUMMARY

A semiconductor device according to the present disclosure includes a semiconductor chip, a first capacitor, and a first bonding wire. The semiconductor chip includes a substrate, a transistor provided on an upper surface of the substrate and having an input electrode to which a high frequency signal is input, an output electrode from which the high frequency signal is output, and a reference potential electrode to which a reference potential is supplied, and a metal pattern provided on the upper surface of the substrate and electrically connected to the reference potential electrode. The first capacitor includes a first lower electrode provided on the metal pattern and electrically connected to the metal pattern, a first dielectric layer provided on the first lower electrode, and a first upper electrode provided on the first dielectric layer. The first bonding wire electrically connects the first upper electrode and a first electrode which is any one of the input electrode and the output electrode.

DETAILED DESCRIPTION OF EMBODIMENTS

Figure 1:
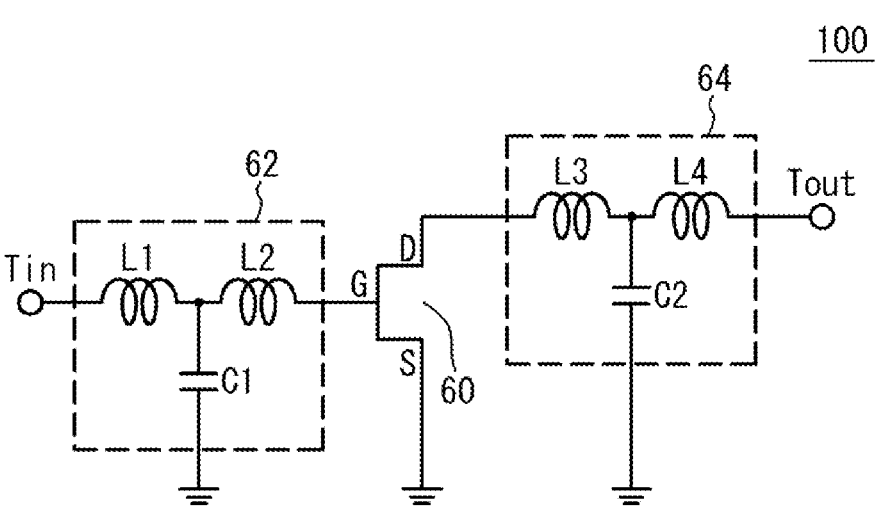
FIG. 1 is a circuit diagram of a semiconductor device according to a first embodiment.

When the heat generated in the transistor is discharged to the base via a substrate of the semiconductor chip, a thermal resistance of the substrate can be reduced by increasing a planar area of the substrate. However, increasing the area of the substrate lengthens the bonding wires that connect the transistor to the matching circuit elements. This makes impedance matching by the matching circuit elements more difficult, and high frequency characteristics may deteriorate.

The present disclosure has been made in view of the above problems, and an object of the present disclosure is to suppress deterioration of high frequency characteristics.

Details of Embodiments of the Present Disclosure

First, the contents of the embodiments of this disclosure are listed and explained.

(1) A semiconductor device according to the present disclosure includes a semiconductor chip, a first capacitor, and a first bonding wire. The semiconductor chip includes a substrate, a transistor provided on an upper surface of the substrate and having an input electrode to which a high frequency signal is input, an output electrode from which the high frequency signal is output, and a reference potential electrode to which a reference potential is supplied, and a metal pattern provided on the upper surface of the substrate and electrically connected to the reference potential electrode. The first capacitor includes a first lower electrode provided on the metal pattern and electrically connected to the metal pattern, a first dielectric layer provided on the first lower electrode, and a first upper electrode provided on the first dielectric layer. The first bonding wire electrically connects the first upper electrode and a first electrode which is any one of the input electrode and the output electrode. Thus, deterioration of the high frequency characteristics can be suppressed.

(2) In the above (1), the first lower electrode may be connected on the metal pattern by using a brazing filler metal.

(3) In the above (1) or (2), the first dielectric layer may be a ceramic substrate or a semiconductor substrate.

(4) In the above (1), the first lower electrode may be in contact with the metal pattern, and the first dielectric layer may be provided from a region of an upper surface of the metal pattern where the first lower electrode is not provided to another region between the first lower electrode and the first upper electrode.

(5) In any one of the above (1) to (4), the semiconductor device further may include a second capacitor including a second lower electrode provided on the metal pattern and electrically connected to the metal pattern, a second dielectric layer provided on the second lower electrode, and a second upper electrode provided on the second dielectric layer, and a second bonding wire electrically connecting the second upper electrode and a second electrode other than the first electrode of the input electrode and the output electrode.

(6) In any one of the above (1) to (5), the semiconductor device further may include a first signal terminal, and a third bonding wire electrically connecting the first upper electrode and the first signal terminal.

(7) In the above (5), the semiconductor device further may include a second signal terminal, and a fourth bonding wire electrically connecting the second upper electrode and the second signal terminal.

(8) In any one of the above (1) to (4), the semiconductor device further may include a conductive base on which the semiconductor chip is mounted and to which a reference potential is supplied, a second capacitor provided on a region of the base other than another region where the semiconductor chip is mounted and including a second lower electrode electrically connected to the base, a second dielectric layer provided on the second lower electrode, and a second upper electrode provided on the second dielectric layer, and a second bonding wire electrically connecting the second upper electrode and a second electrode other than the first electrode of the input electrode and the output electrode.

(9) In the above (5) or (8), the first electrode may be the input electrode, and the second bonding wire may be longer than the first bonding wire.

(10) In any one of the above (1) to (9), the semiconductor device further may include a conductive base on which the semiconductor chip is mounted and to which a reference potential is supplied. The metal pattern and the reference potential electrode may be electrically connected to the base via a via hole penetrating through the substrate.

Specific examples of the semiconductor device in accordance with embodiments of the present disclosure are described below with reference to the drawings. The present disclosure is not limited to these examples, but is indicated by the claims, which are intended to include all modifications within the meaning and scope of the claims.

First Embodiment

FIG. 1 is a circuit diagram of a semiconductor device according to a first embodiment. As illustrated in FIG. 1, a semiconductor device 100 includes a transistor 60 and matching circuits 62 and 64. The transistor 60 is, for example, a field effect transistor (FET) and includes a source S, a drain D, and a gate G. The matching circuit 62 is connected between an input terminal Tin and the gate G. In the matching circuit 62, inductors L1 and L2 are connected in series between the input terminal Tin and the gate G. A capacitor C1 is shunt-connected to a node between the inductors L1 and L2. The matching circuit 64 is connected between an output terminal Tout and the drain D. In the matching circuit 64, inductors L3 and L4 are connected in series between the output terminal Tout and the drain D. A capacitor C2 is shunt-connected to a node between the inductors L3 and L4.

The matching circuit 62 matches an impedance seen from the input terminal Tin to the matching circuit 62 with an impedance seen from the matching circuit 62 to the gate G. The matching circuit 64 matches an impedance seen from the drain D to the matching circuit 64 with an impedance seen from the matching circuit 64 to the output terminal Tout. A high frequency signal inputted to the input terminal Tin is amplified by the transistor 60. The amplified high frequency signal is output from the output terminal Tout. The frequency of the high frequency signal is, for example, 30 MHz to 300 GHz, and when the semiconductor device 100 is used in a base station for mobile communication, the frequency of the high frequency signal is, for example, 0.5 GHz to 10 GHz.

Figure 2:
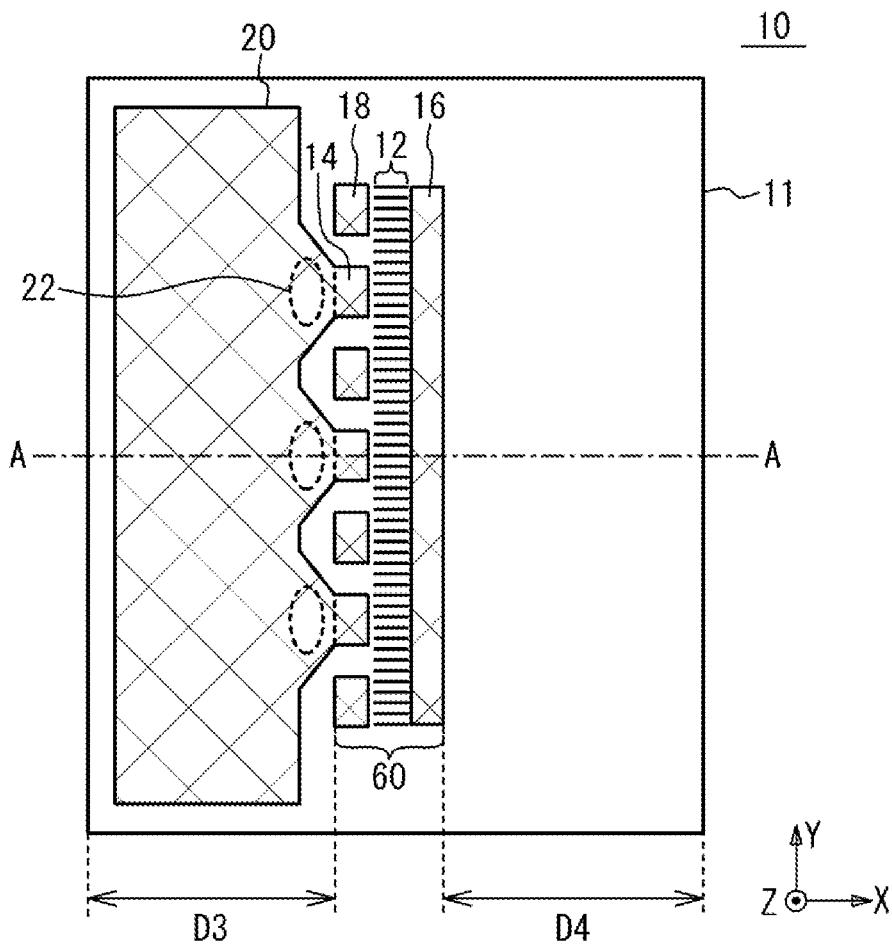
FIG. 2 is a plan view of a semiconductor chip according to the first embodiment.
Figure 3:
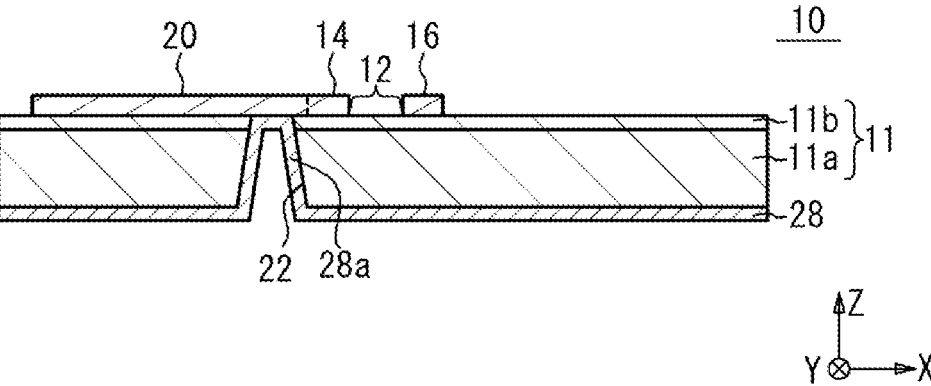
FIG. 3 is a cross-sectional view taken along line A-A of FIG. 2.

FIG. 2 is a plan view of the semiconductor chip according to the first embodiment. FIG. 3 is a cross-sectional view taken along the line A-A of FIG. 2. In FIG. 2, source electrodes 14, a drain electrode 16, gate electrodes 18, and a metal pattern 20 are cross-hatched. A normal direction of an upper surface of a substrate 11 is a Z direction, a direction from the source electrodes 14 to the drain electrode 16 is an X direction, and an extending direction of the drain electrode 16 is a Y direction.

As illustrated in FIGS. 2 and 3, the substrate 11 includes a substrate 11a and a semiconductor layer 11b provided on the substrate 11a. An active region 12 is provided on the substrate 11. A region other than the active region 12 is an inactive region in which the semiconductor layer 11b is inactivated by ion implantation or the like. The source electrodes 14, the drain electrode 16, the gate electrodes 18 and the metal pattern 20 are provided on an upper surface of the substrate 11. The source electrodes 14 and the gate electrodes 18 are alternately provided in the Y direction. The drain electrode 16 is provided in a positive direction of the X direction (hereinafter referred to as a +X direction) of the source electrodes 14 and the gate electrodes 18. The active region 12 is provided between the drain electrode 16, and the source electrodes 14 and the gate electrodes 18. The active region 12 includes a plurality of source fingers, a plurality of drain fingers, and a plurality of gate fingers extending in the X direction (not illustrated). The plurality of source fingers, the plurality of drain fingers, and the plurality of gate fingers are electrically connected and short-circuited to the source electrodes 14, the drain electrode 16, and the gate electrodes 18, respectively. The transistor 60 includes the active region 12, the source electrodes 14, the drain electrode 16, and the gate electrodes 18. The source electrodes 14, the drain electrode 16 and the gate electrodes 18 correspond to the source S, the drain D and the gate G, respectively.

The metal pattern 20 is provided in a negative direction of the X direction (hereinafter referred to as a −X direction) of the source electrodes 14. The metal pattern 20 is electrically connected and short-circuited to the source electrodes 14. A metal layer 28 is provided on a lower surface of the substrate 11. A via hole 22 is provided so as to overlap with the metal pattern 20 when viewed from the Z direction. The via hole 22 penetrates through the substrate 11. A metal layer 28a is provided on an inner surface of the via hole 22. The metal layers 28 and 28a are made of the same metal. The metal pattern 20 is electrically connected and short-circuited to the metal layer 28 through the via hole 22.

When a semiconductor chip 10 is, for example, a nitride semiconductor chip, the substrate 11a is, for example, a silicon carbide (SiC) substrate, a diamond substrate, a silicon substrate, a gallium nitride (GaN) substrate, or a sapphire substrate. The semiconductor layer 11b includes, for example, a nitride semiconductor layer such as a GaN layer, an aluminum gallium nitride (AlGaN) layer and/or an indium gallium nitride (InGaN) layer. When the transistor is a GaN HEMT (High Electron Mobility Transistor), the semiconductor layer 11b includes a GaN electron transport layer and an AlGaN barrier layer provided on the GaN electron transport layer. When the semiconductor device is, for example, a GaAs-based semiconductor device, the substrate 11a is, for example, a gallium arsenide (GaAs) substrate. The semiconductor layer 11b includes, for example, a GaAs layer, an aluminum gallium arsenide (AlGaAs) layer and/or an indium gallium arsenide (InGaAs) layer. The source electrodes 14, the drain electrode 16, the gate electrodes 18, the metal pattern 20, and the metal layers 28 and 28a include a gold layer, for example.

Figure 4:
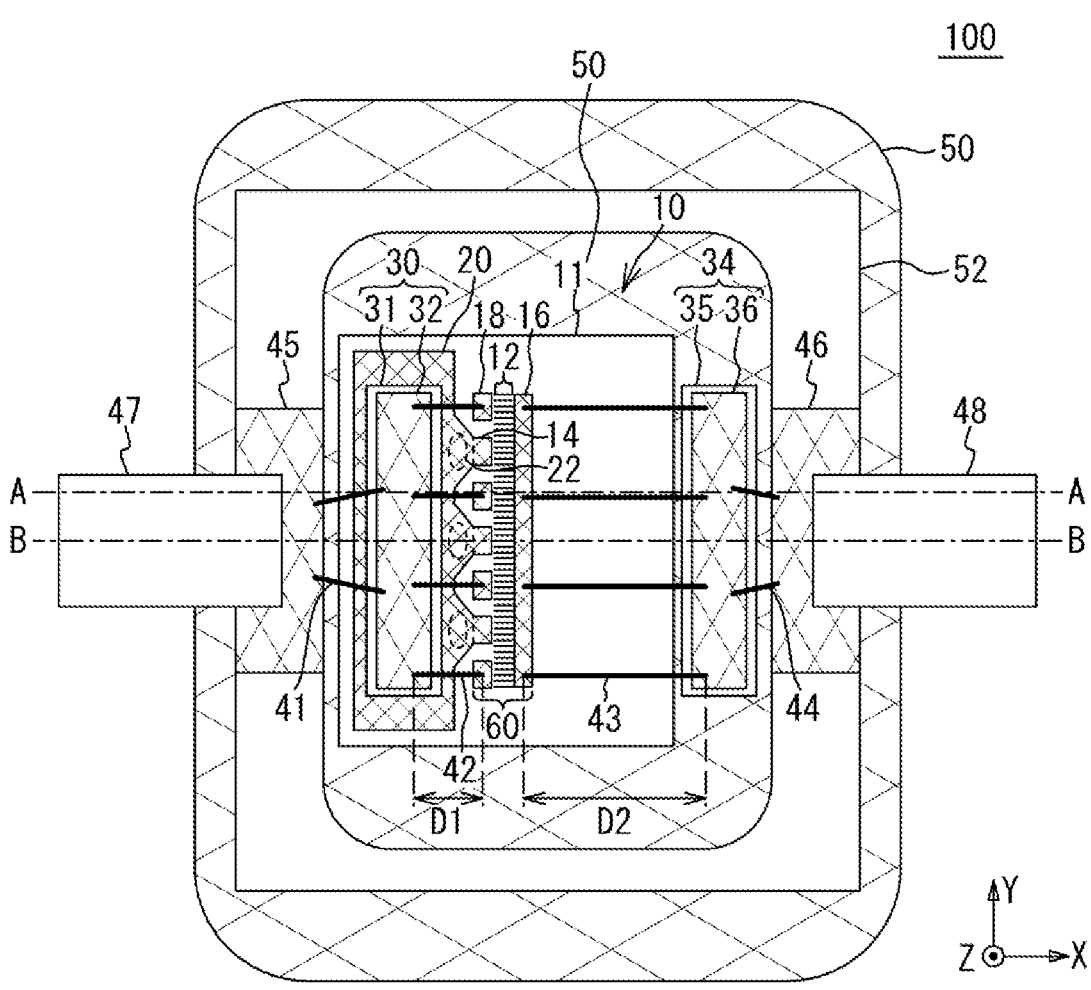
FIG. 4 is a plan view of the semiconductor device according to the first embodiment.
Figure 5:
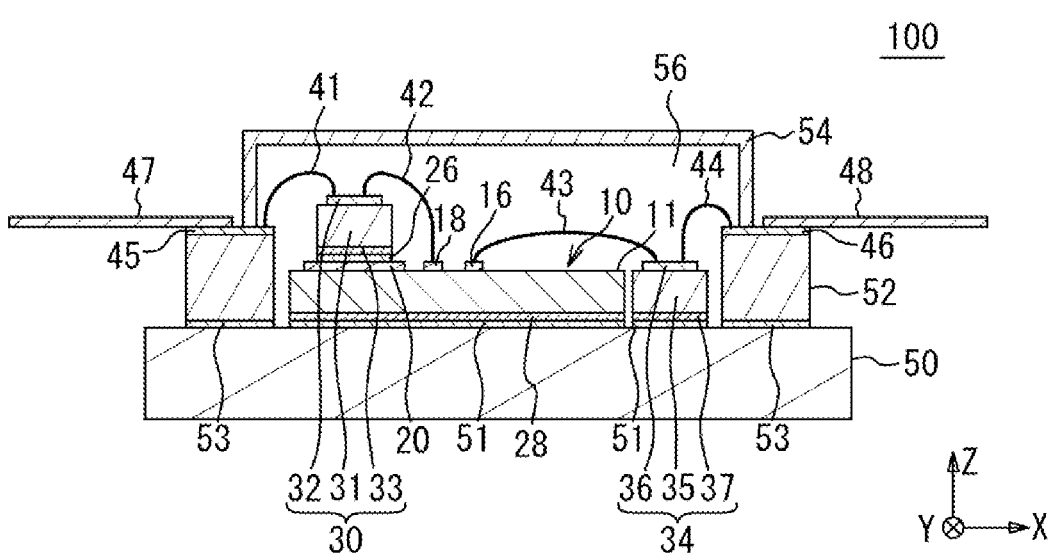
FIG. 5 is a cross-sectional view taken along line A-A of FIG. 4.
Figure 6:
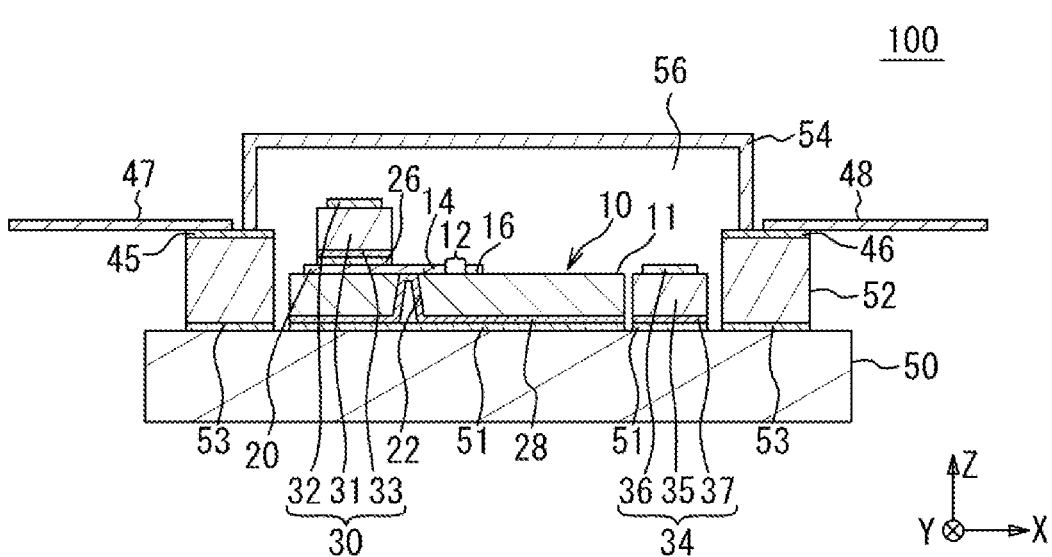
FIG. 6 is a cross-sectional view taken along line B-B of FIG. 4.

FIG. 4 is a plan view of the semiconductor device according to the first embodiment. FIG. 5 is a cross-sectional view taken along the line A-A of FIG. 4. FIG. 6 is a cross-sectional view taken along the line B-B of FIG. 4. In FIG. 4, a lid 54 is not illustrated. The source electrodes 14, the drain electrode 16, the gate electrodes 18, the metal pattern 20, a base 50, an input pattern 45, and an output pattern 46 are cross-hatched. A normal direction of the upper surface of the base 50 is defined as the Z direction, a direction from an input lead to an output lead is defined as the X direction, and a direction crossing the X direction and the Z direction is defined as the Y direction.

As illustrated in FIGS. 4 to 6, the semiconductor chip 10 and a capacitor 34 are mounted on the base 50. At least an upper surface of the base 50 is a conductive layer. An insulating frame 52 is mounted on the base 50 so as to surround the semiconductor chip 10 and the capacitor 34. The capacitor 34 includes a dielectric layer 35, an upper electrode 36 and a lower electrode 37 sandwiching the dielectric layer 35.

The base 50 and the metal layer 28 of the semiconductor chip 10 are bonded to each other by a conductive bonding layer 51. Thus, the base 50 and the metal layer 28 are electrically connected and short-circuited to each other. The base 50 and the lower electrode 37 of the capacitor 34 are bonded to each other by the conductive bonding layer 51. Thus, the base 50 and the lower electrode 37 are electrically connected and short-circuited. The base 50 and the frame 52 are bonded to each other by a bonding layer 53.

A capacitor 30 is mounted on the metal pattern 20 of the semiconductor chip 10. The capacitor 30 includes a dielectric layer 31, an upper electrode 32 and a lower electrode 33 sandwiching the dielectric layer 31. The metal pattern 20 and the lower electrode 33 are bonded to each other by a conductive bonding layer 26. Thus, the metal pattern 20 and the lower electrode 33 are electrically connected and short-circuited to each other.

In a plan view, the input pattern 45 and the output pattern 46, which are metal patterns, are provided at opposing positions on the frame 52. An input lead 47 and an output lead 48 are electrically connected to the input pattern 45 and the output pattern 46, respectively. The lid 54 is bonded on the frame 52. The semiconductor chip 10 is sealed in a gas 56 such as an air or inert gas by the lid 54.

Bonding wires 41 electrically connect the input pattern 45 and the upper electrode 32 of the capacitor 30. Bonding wires 42 electrically connect the upper electrode 32 of the capacitor 30 and the gate electrodes 18. Bonding wires 43 electrically connect the drain electrode 16 and the upper electrode 36 of the capacitor 34. Bonding wires 44 electrically connect the upper electrode 36 of the capacitor 34 and the output pattern 46.

The bonding wires 41 and 42 correspond to the inductors L1 and L2 in FIG. 1, respectively, and the bonding wires 43 and 44 correspond to the inductors L3 and L4 in FIG. 1, respectively. The capacitors 30 and 34 correspond to the capacitors C1 and C2 in FIG. 1, respectively. When a reference potential such as a ground potential is supplied to the base 50, the reference potential is supplied to the source electrodes 14 from the base 50 via the bonding layer 51, the metal layer 28, the metal layer 28a and the metal pattern 20. The reference potential is supplied to the lower electrode 33 of the capacitor 30 from the base 50 via the bonding layer 51, the metal layer 28, the metal layer 28a, the metal pattern 20, and the bonding layer 26. The reference potential is supplied to the lower electrode 37 of the capacitor 34 from the base 50 via the bonding layer 51.

The high frequency signal is input from the input lead 47 to the gate electrodes 18 via the input pattern 45, the bonding wire 41, the upper electrode 32 and the bonding wire 42. The high frequency signal amplified by the transistor 60 is output from the drain electrode 16 to the output lead 48 via the bonding wire 43, the upper electrode 36, the bonding wire 44 and the output pattern 46.

The base 50 is a metal layer such as a copper layer, for example. The frame 52 is made of a ceramic insulator such as alumina. The lid 54 is made of an insulator such as ceramics or a metal. The dielectric layers 31 and 35 are inorganic insulating layers such as barium titanate or semiconductor layers such as silicon. The upper electrodes 32 and 36, the lower electrodes 33 and 37, the input pattern 45 and the output pattern 46 are metal layers such as gold layers, for example. The bonding wires 41 to 44 are metal wires such as gold wires, for example. The input lead 47 and the output lead 48 are metal leads such as Kovar.

As an example, the widths of the base 50 in the X direction and the Y direction are 8 mm and 10 mm, respectively. As an example, the widths of the semiconductor chip 10 in the X direction and the Y direction are 3.75 mm and 4.6 mm, respectively. As an example, the widths of the capacitors 30 and 34 in the X direction and the Y direction are 0.9 mm and 3.5 mm, respectively. As an example, the widths of the input lead 47 and the output lead 48 in the X direction and the Y direction are 2.5 mm and 1.5 mm, respectively.

First Comparative Example

Figure 7:
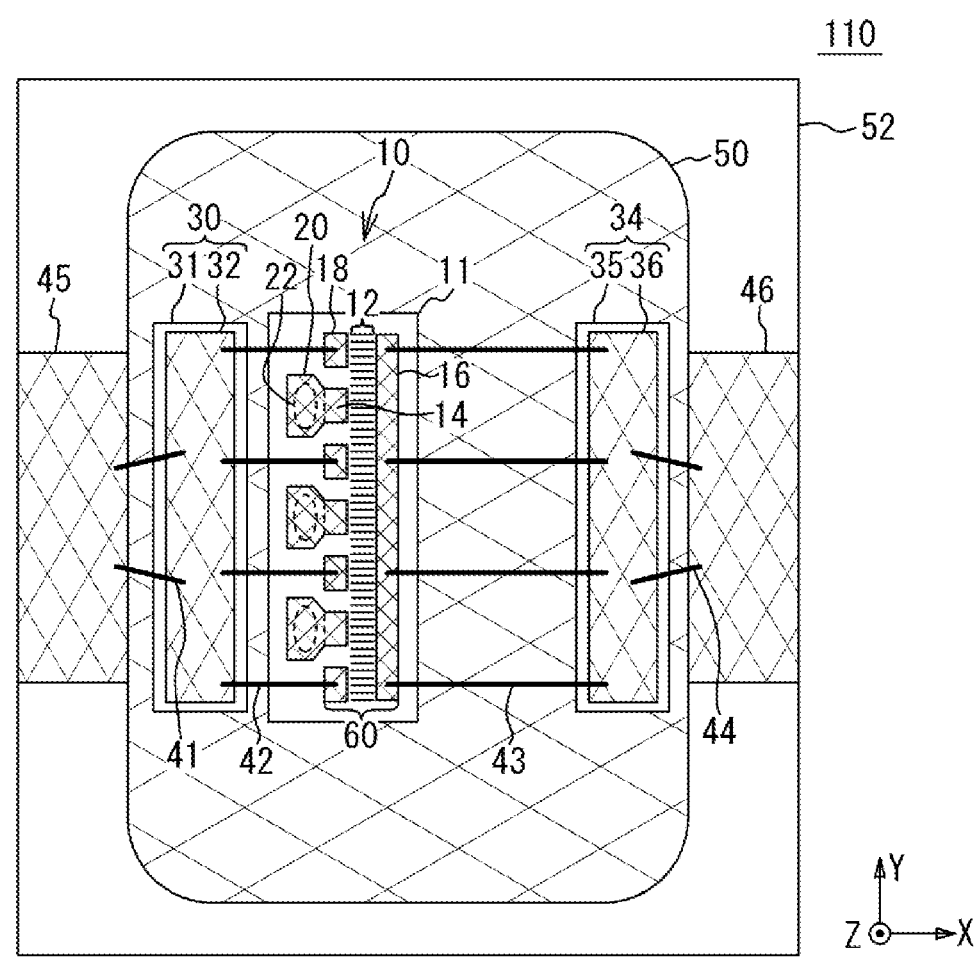
FIG. 7 is a plan view of a semiconductor device according to a first comparative example.

FIG. 7 is a plan view of a semiconductor device according to a first comparative example. The base 50, the input lead 47, and the output lead 48 outside the frame 52 are not illustrated. As illustrated in FIG. 7, in a semiconductor device 110 of the first comparative example, the capacitor 30 is not mounted on the semiconductor chip 10 but is mounted on the base 50. The semiconductor chip 10 is mounted near the capacitor 30 of the capacitors 30 and 34. Thus, the bonding wires 42 are shorter than the bonding wires 43. This is because the gate input impedance of the FET is smaller than the drain output impedance, so that the inductance of the inductor L2 is made smaller than the inductance of the inductor L3 when performing impedance matching.

In order to increase the output of the transistor 60, it is required to reduce the thermal resistance of the substrate 11 and discharge the heat generated in the transistor 60 to the base 50. For example, when a silicon carbide substrate is used as the substrate 11a, the thermal conductivity of the silicon carbide the is high, so that heat dissipation can be improved. In order to reduce the thermal resistance of the substrate 11, it is conceivable to increase a planar area of the semiconductor chip 10.

Second Comparative Example

Figure 8:
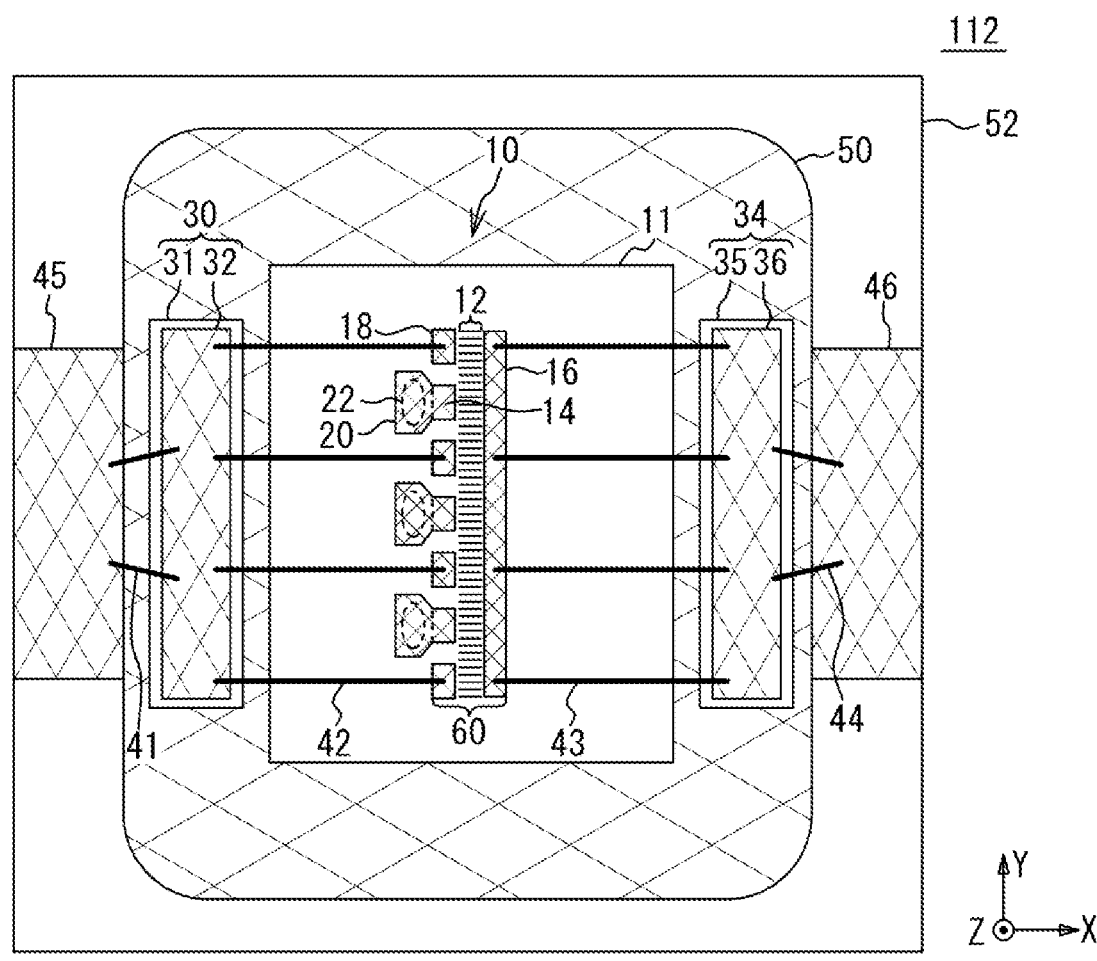
FIG. 8 is a plan view of a semiconductor device according to a second comparative example.

FIG. 8 is a plan view of a semiconductor device according to a second comparative example. The base 50, the input lead 47, and the output lead 48 outside the frame 52 are not illustrated. As illustrated in FIG. 8, in a semiconductor device 112 of the second comparative example, the planar area of the semiconductor chip 10 is made larger than that of the first comparative example. The transistor 60 is provided near the center of the semiconductor chip 10 in the X direction. This is because the heat of the transistor 60 is symmetrically conducted in the +X direction and the −X direction, thereby reducing the thermal resistance. Therefore, intervals between the capacitor 30 and the gate electrodes 18 become large. As a result, the bonding wires 42 of the second comparative example become longer than those of the first comparative example. The lengths of the bonding wires 42 are determined so that the matching circuit 62 functions. As the lengths of the bonding wires 42 are increased, the inductance of the inductor L2 is increased. This makes it difficult to match the input impedance of the input lead 47 with the input impedance of the gate electrodes 18. Therefore, desired high frequency characteristics of the semiconductor device 112 cannot be obtained, and the high frequency characteristics may deteriorate.

According to the first embodiment, the semiconductor chip 10 includes the transistor 60 provided on the upper surface of the substrate 11 and the metal pattern 20 electrically connected to the source electrodes 14 provided on the upper surface of the substrate 11. The transistor 60 has the gate electrodes 18 (input electrode) to which the high frequency signal is input, the drain electrode 16 (output electrode) from which the high frequency signal is output, and the source electrodes 14 (reference potential electrode) to which the reference potential is supplied. The capacitor 30 (first capacitor) is provided on the metal pattern 20. The capacitor 30 includes the lower electrode 33 (first lower electrode) provided on the metal pattern 20 and electrically connected to the metal pattern 20, the dielectric layer 31 (first dielectric layer) provided on the lower electrode 33, and the upper electrode 32 (first upper electrode) provided on the dielectric layer 31.

Thus, the reference potential is supplied to the lower electrode 33 of the capacitor 30. Since the metal pattern 20 is provided on the substrate 11, the planar area of the substrate 11 can be increased and the thermal resistance of the substrate 11 can be reduced. The bonding wires 42 (first bonding wire) electrically connect the upper electrode 32 and the gate electrodes 18. Thus, the matching circuit 62 can be formed by the capacitor 30 and the bonding wires 42. Since the bonding wires 42 can be shortened, desired impedance matching can be achieved by the matching circuit 62. Therefore, the high frequency characteristics of the semiconductor device 100 can be improved.

The lower electrode 33 of the capacitor 30 is bonded on the metal pattern 20 using a brazing filler metal. Thus, the lower electrode 33 of the capacitor 30 can be set to the reference potential, and the capacitor 30 can be shunt-connected. The brazing filler metal is, for example, a solder such as tin-silver-copper or gold-tin, or a metal paste such as a silver paste.

The dielectric layer 31 of the capacitor 30 is a ceramic substrate. The capacitor 30 can be reduced in size by using a material having a high relative dielectric constant (for example, a relative dielectric constant of 10 or more or 100 or more) as the material of the ceramic substrate. Further, the loss can be reduced by using a material having a small dielectric loss as the material of the ceramic substrate.

The dielectric layer 31 of the capacitor 30 may be a semiconductor substrate. The semiconductor substrate is, for example, a silicon substrate. By using the dielectric layer 31 as the semiconductor substrate, an IPD (Integrated Passive Device) in which a passive element (for example, a resistor and an inductor) other than a capacitor is integrated in the dielectric layer 31 can be used. As described above, the capacitor 30 may be a capacitor provided in the IPD.

The bonding wires 41 (third bonding wire) electrically connect the upper electrode 32 of the capacitor 30 and the input pattern 45 (first signal terminal). Thus, the matching circuit 62 can be formed by the bonding wires 41 and 42 and the capacitor 30. The inductor L1 may not be provided in the matching circuit 62.

The capacitor 34 (second capacitor) includes the lower electrode 37 (second lower electrode) which is provided on a region of the conductive base 50 other than a region where the semiconductor chip 10 is mounted and which is electrically connected to the base 50, the dielectric layer 35 (second dielectric layer) provided on the lower electrode 37, and the upper electrode 36 (second upper electrode) provided on the dielectric layer 35. The bonding wires 43 (second bonding wire) electrically connect the upper electrode 36 and the drain electrode 16. Thus, the matching circuit 64 can be formed by the capacitor 34 and the bonding wires 43.

The bonding wires 44 (fourth bonding wire) electrically connects the upper electrode 36 of the capacitor 34 and the output pattern 46 (second signal terminal). Thus, the matching circuit 64 can be formed by the bonding wires 43 and 44 and the capacitor 34. It should be noted that the inductor L4 may not be provided in the matching circuit 64. The dielectric layer 35 of the capacitor 34 can be the same ceramic substrate or semiconductor substrate as the dielectric layer 31 of the capacitor 30.

As illustrated in FIG. 4, lengths D2 of the bonding wires 43 are longer than lengths D1 of the bonding wires 42. Thus, the input impedance of the input lead 47 can be matched with the input impedance of the gate electrodes 18, and the output impedance of the output lead 48 can be matched with the output impedance of the drain electrode 16. It should be noted that the lengths D1 and D2 are not planar lengths but three-dimensional lengths. The length D2 is preferably 1.2 times or more, or 1.5 times or more, and 10 times or less of the length D1.

The metal pattern 20 and the source electrodes 14 are electrically connected and short-circuited to the conductive base 50 via the via hole 22 penetrating through the substrate 11. Thus, the reference potential can be supplied to the metal pattern 20 and the source electrodes 14.

In FIG. 2, a distance D3 is a distance in the X direction between ends of the gate electrodes 18 in the −X direction and a side of the substrate 11 in the −X direction, and a distance D4 is a distance in the X direction between an end of the drain electrode 16 in the +X direction and a side of the substrate 11 in the +X direction. From the viewpoint of conducting the heat of the transistor 60 symmetrically in the +X direction and the −X direction, the distance D3 is preferably 0.5 times or more and 2 times or less and more preferably ⅔ times or more and 1.5 times or less of the distance D4.

Second Embodiment

Figure 9:
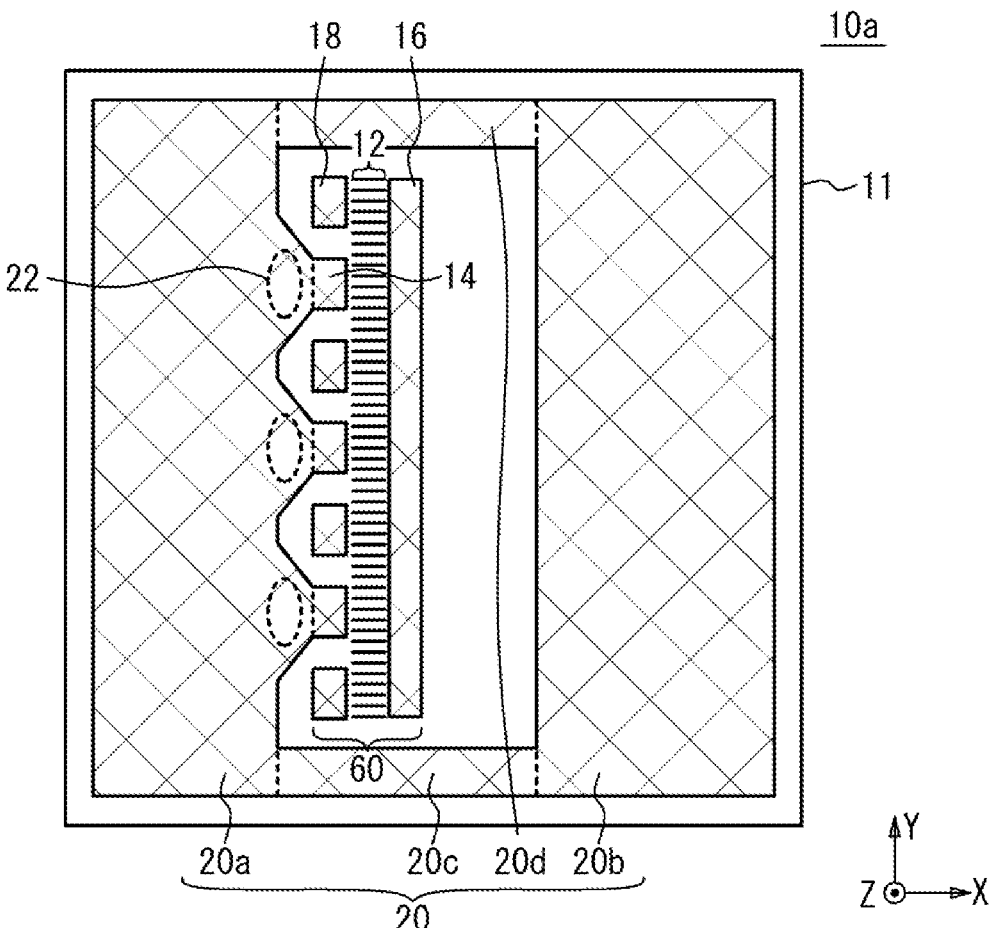
FIG. 9 is a plan view of a semiconductor chip according to a second embodiment.

FIG. 9 is a plan view of a semiconductor chip according to a second embodiment. As illustrated in FIG. 9, in a semiconductor chip 10a, the metal pattern 20 has mounting regions 20a and 20b and connection regions 20c and 20d. The mounting region 20a is provided between the transistor 60 and the side of the substrate 11 in the –X direction, and the mounting region 20b is provided between the transistor 60 and the side of the substrate 11 in the +X direction. The connection region 20c is provided between the transistor 60 and the side of the substrate 11 in a –Y direction. The connection region 20d is provided between the transistor 60 and the side of the substrate 11 in a +Y direction. The connection regions 20c and 20d connect the mounting regions 20a and 20b. Thus, the mounting regions 20a and 20b are electrically short-circuited to have the same potential. Either of the connection regions 20c and 20d may not be provided.

Figure 10:
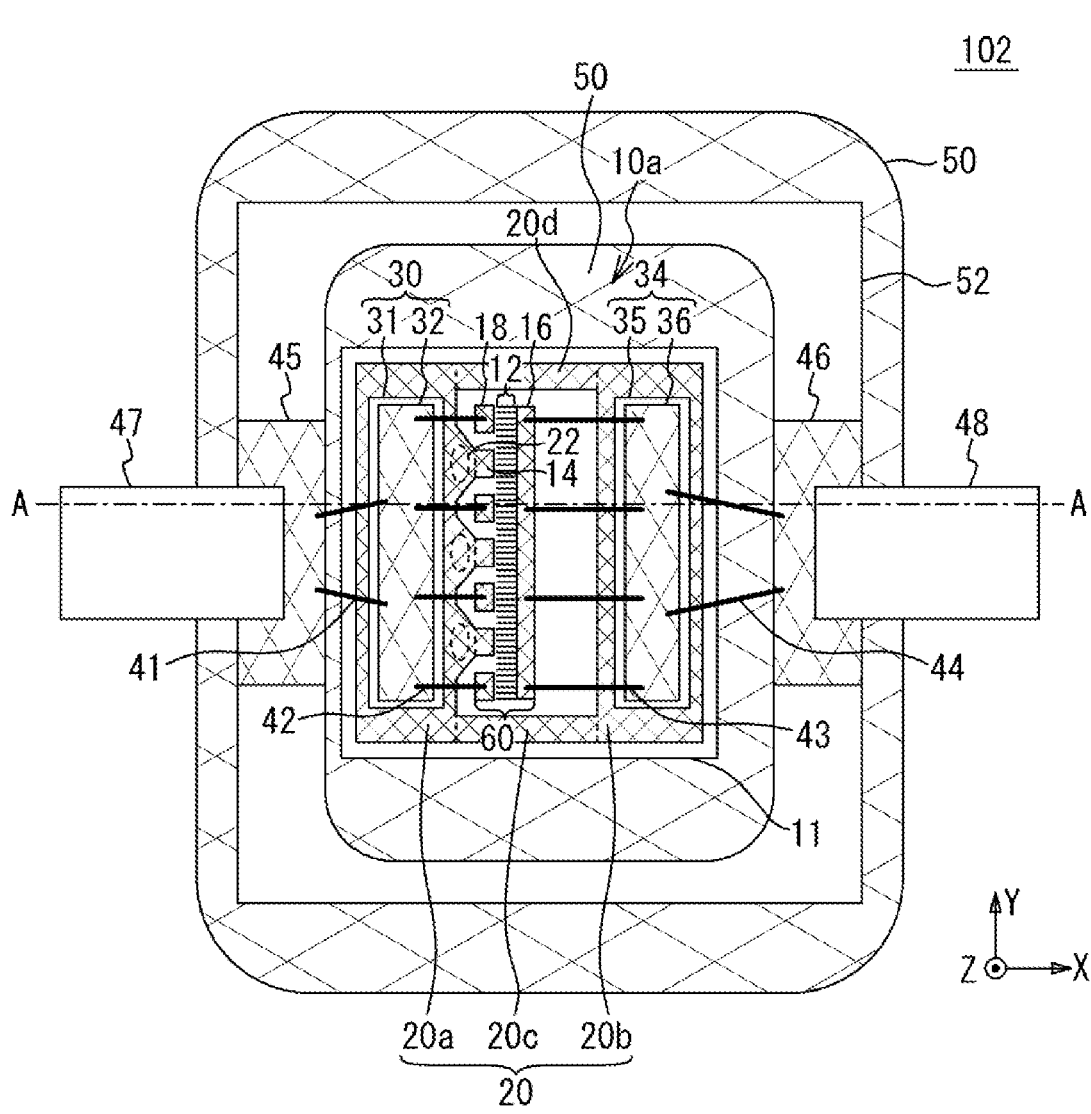
FIG. 10 is a plan view of a semiconductor device according to a second embodiment.
Figure 11:
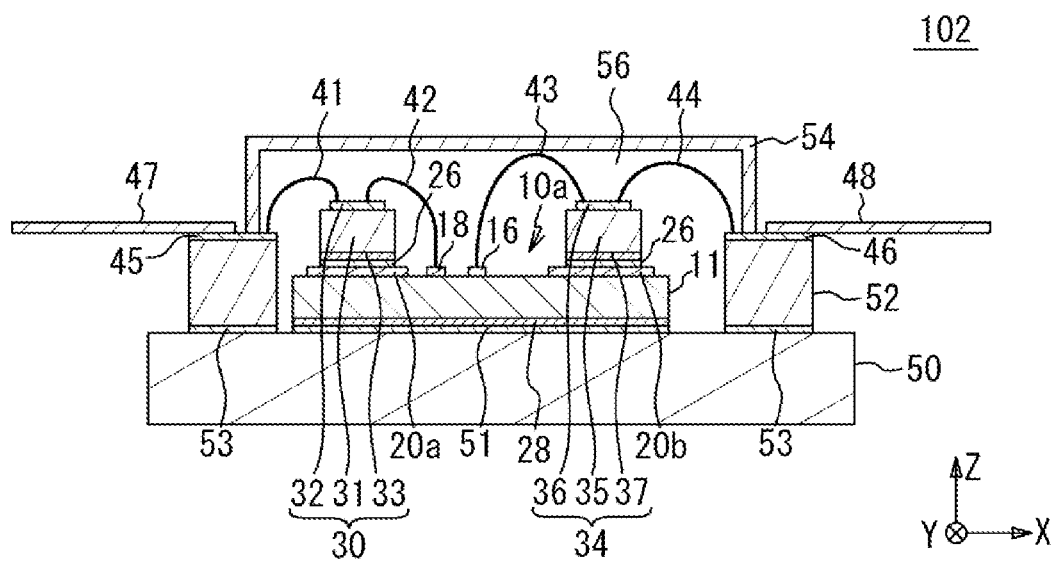
FIG. 11 is a cross-sectional view taken along line A-A of FIG. 10.

FIG. 10 is a plan view of a semiconductor device according to the second embodiment. FIG. 11 is a cross-sectional view taken along the line A-A of FIG. 10. In FIG. 10, the lid 54 is not illustrated.

As illustrated in FIGS. 10 and 11, in a semiconductor device 102 of the second embodiment, the capacitor 30 is mounted on the mounting region 20a of the metal pattern 20. The capacitor 34 is mounted on the mounting region 20b of the metal pattern 20. The lower electrode 33 of the capacitor 30 is bonded to the mounting region 20a by the bonding layer 26, and the lower electrode 37 of the capacitor 34 is bonded to the mounting region 20b by the bonding layer 26. The bonding layer 26 is, for example, a brazing filler metal. The bonding wires 43 electrically connects the drain electrode 16 and the upper electrode 36 of the capacitor 34, and the bonding wires 44 electrically connects the upper electrode 36 of the capacitor 34 and the output pattern 46. Other configurations of the second embodiment are the same as those of the first embodiment, and description thereof is omitted.

According to the second embodiment, the lower electrode 37 of the capacitor 34 is provided on the mounting region 20b of the metal pattern 20 and is electrically connected to the metal pattern 20. Thus, the reference potential is supplied to the lower electrode 37 of the capacitor 34. Since the mounting regions 20a and 20b of the metal pattern 20 are provided on the substrate 11, the planar area of the substrate 11 can be increased and the thermal resistance of the substrate 11 can be reduced. The bonding wires 43 (second bonding wire) electrically connect the upper electrode 36 and the drain electrode 16. Thus, the matching circuit 64 can be formed by the capacitor 34 and the bonding wires 43.

The bonding wires 44 (fourth bonding wire) electrically connect the upper electrode 36 of the capacitor 34 and the output pattern 46 (second signal terminal). Thus, the matching circuit 64 can be formed by the bonding wires 43 and 44 and the capacitor 34. It should be noted that the inductor L4 may not be provided in the matching circuit 64.

In the first embodiment, an example in which the capacitor 30 is mounted on the metal pattern 20 and the capacitor 34 is not mounted on the semiconductor chip 10 has been described, and in the second embodiment, an example in which the capacitors 30 and 34 are mounted on the metal pattern 20 has been described. The capacitor 34 may be mounted on the metal pattern 20, and the capacitor 30 may not be mounted on the semiconductor chip 10. As described above, a first electrode to which the first bonding wire is connected may be any one of the gate electrode and the drain electrode. A second electrode to which the second bonding wire is connected may be an electrode other than the first electrode of the gate electrode and the drain electrode.

In the matching circuit 62 for matching the input impedance of the input electrode of the transistor 60, the inductance of the inductor L2 may be small in many cases. Therefore, the first electrode to which the first bonding wire is connected is preferably the input electrode.

Third Embodiment

Figure 12:
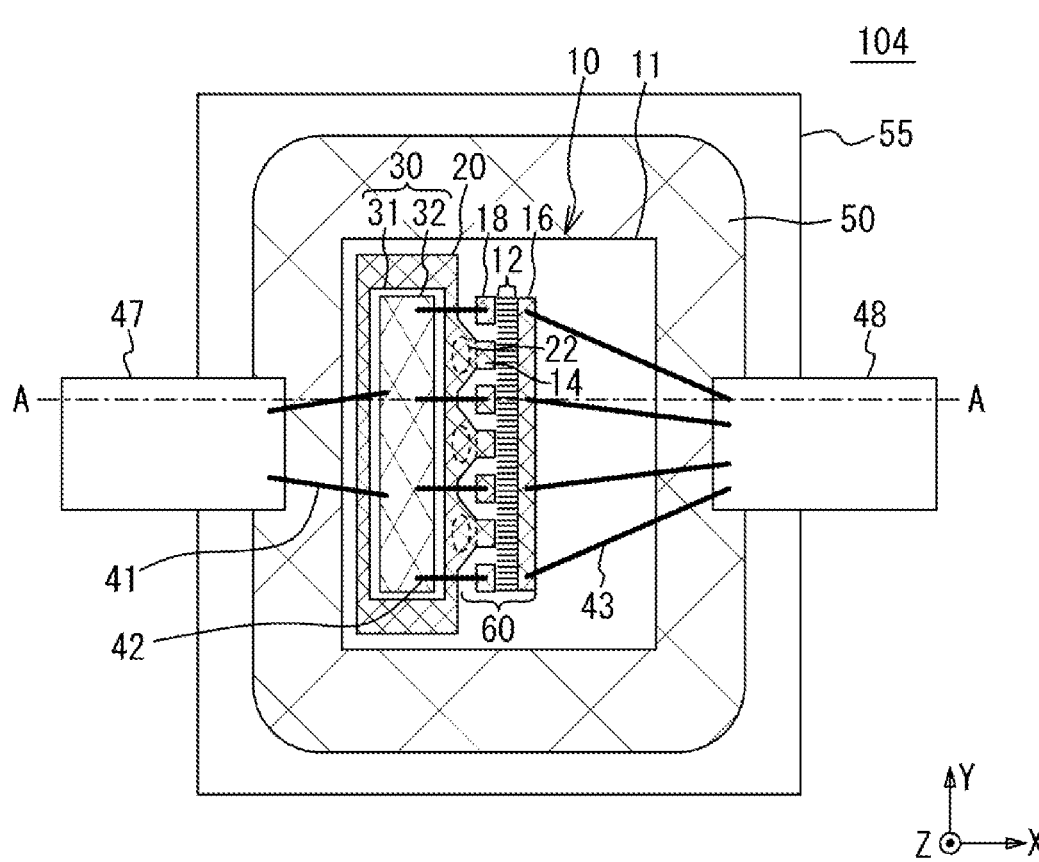
FIG. 12 is a plan view of a semiconductor device according to a third embodiment.
Figure 13:
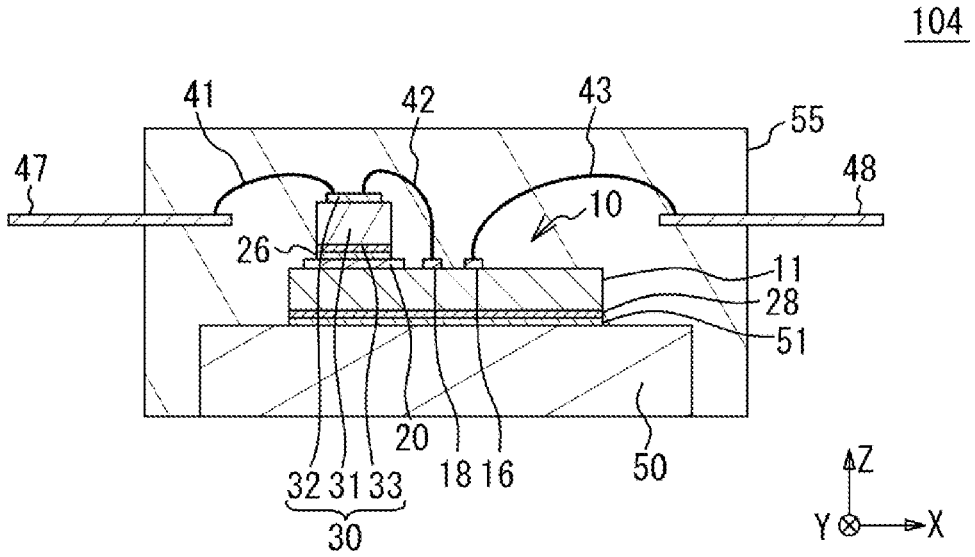
FIG. 13 is a cross-sectional view taken along line A-A of FIG. 12.

FIG. 12 is a plan view of a semiconductor device according to a third embodiment. FIG. 13 is a cross-sectional view taken along the line A-A of FIG. 12. FIG. 12 shows the surface of the base 50 through the sealing resin 55. FIG. 12 illustrates the upper surface of the base 50 as seen through a sealing resin 55.

As illustrated in FIGS. 12 and 13, in a semiconductor device 104 of the third embodiment, the frame 52 and the capacitor 34 are not provided on the base 50. The base 50, the semiconductor chip 10 and the capacitor 30 are sealed with the sealing resin 55. The sealing resin 55 is, for example, an epoxy resin. The bonding wires 41 electrically connect the input lead 47 as a first signal terminal and the upper electrode 32 of the capacitor 30, and the bonding wires 43 electrically connect the drain electrode 16 and the output lead 48 as a second signal terminal. Other configurations of the third embodiment are the same as those of the first embodiment, and description thereof is omitted.

As in the third embodiment, the semiconductor chip 10 and the capacitor 30 may be sealed with the sealing resin 55. The capacitor 34 may not be provided, and the drain electrode 16 and the output lead 48 may be connected by the bonding wires 43. In this case, the bonding wires 43 form a part of the inductor L3 of the matching circuit 64, and the capacitor C2 and the inductor L4 may be provided outside the semiconductor device 104. The semiconductor chip 10a of the second embodiment may be used as the semiconductor chip 10 of the third embodiment. In this case, the capacitor 34 is built in the semiconductor device.

Fourth Embodiment

Figure 14:
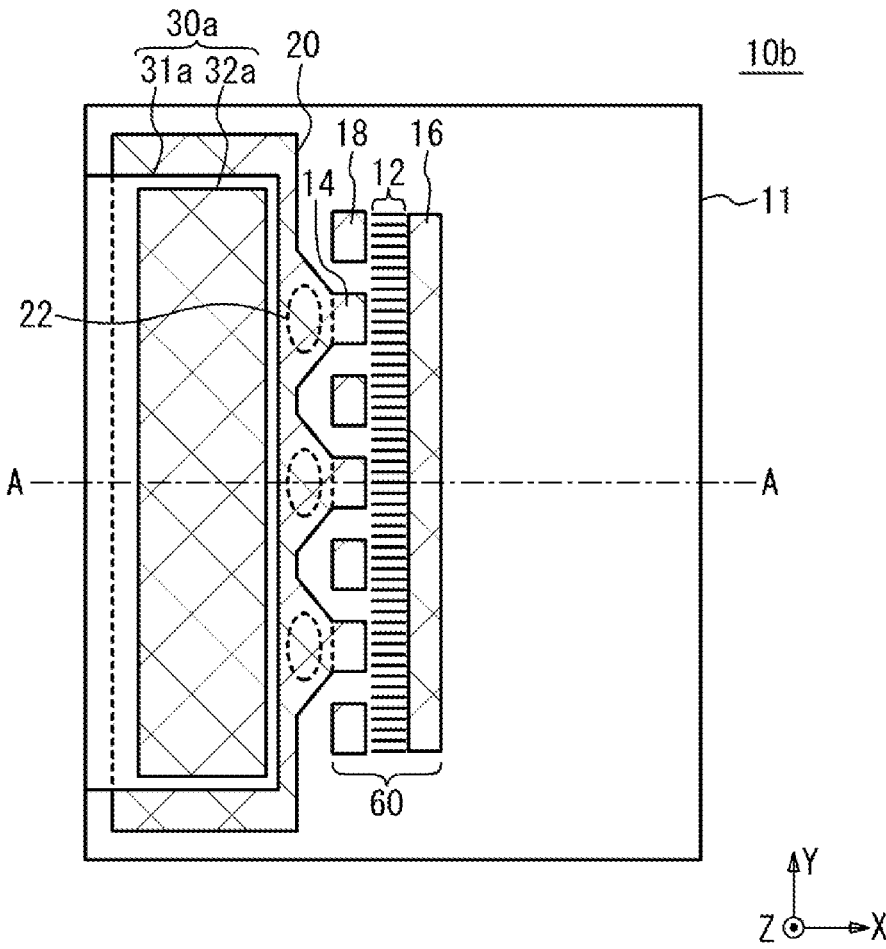
FIG. 14 is a plan view of a semiconductor chip according to a fourth embodiment.
Figure 15:
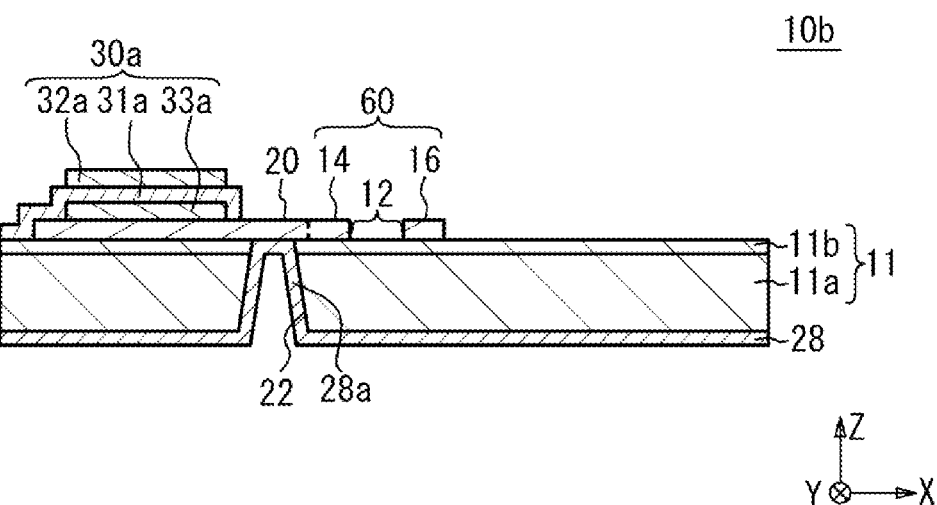
FIG. 15 is a cross-sectional view taken along line A-A of FIG. 14.

FIG. 14 is a plan view of a semiconductor chip according to a fourth embodiment. FIG. 15 is a cross-sectional view taken along the line A-A of FIG. 14. As illustrated in FIGS. 14 and 15, in a semiconductor chip 10b, a lower electrode 33a is directly provided on the metal pattern 20, and a dielectric layer 31a is provided in a range larger than the lower electrode 33a in a plan view so as to cover the lower electrode 33a. An upper electrode 32a is provided on the dielectric layer 31a. A capacitor 30a includes the lower electrode 33a, the dielectric layer 31a and the upper electrode 32a. The lower electrode 33a and the upper electrode 32a are metal layers including, for example, a gold layer, and the dielectric layer 31a is, for example, a silicon nitride layer or a silicon oxide layer.

Figure 16A:
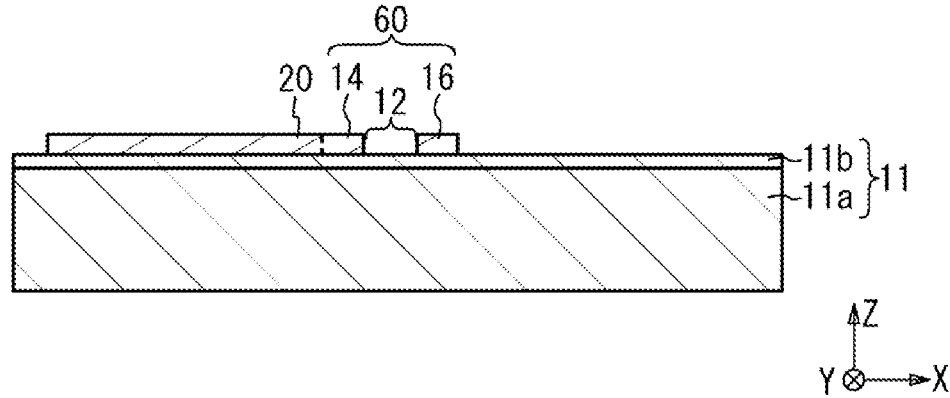
FIG. 16A is a cross-sectional view illustrating a method of manufacturing the semiconductor chip according to the fourth embodiment.
Figure 16B:
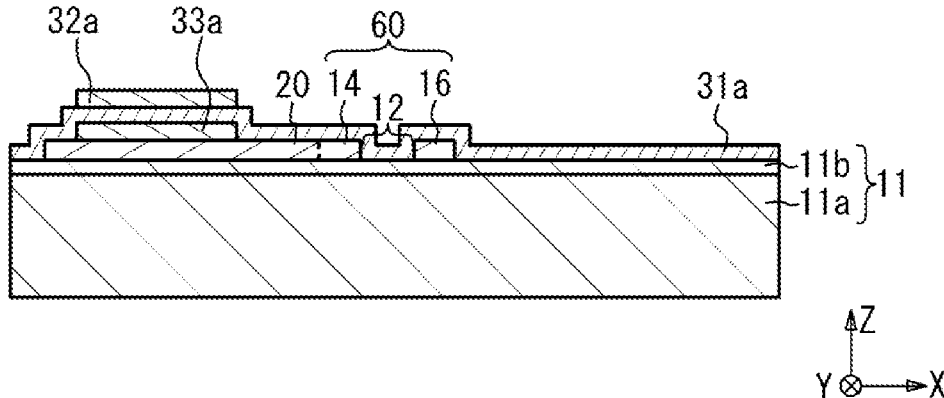
FIG. 16B is a cross-sectional view illustrating a method of manufacturing the semiconductor chip according to the fourth embodiment.
Figure 16C:
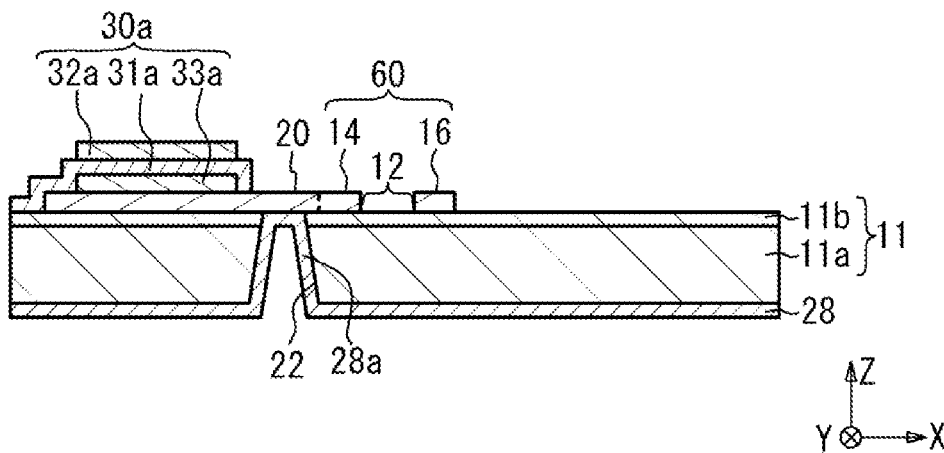
FIG. 16C is a cross-sectional view illustrating a method of manufacturing the semiconductor chip according to the fourth embodiment.

FIGS. 16A to 16C are cross-sectional views illustrating a method of manufacturing the semiconductor chip according to the fourth embodiment. As illustrated in FIG. 16A, the transistor 60 and the metal pattern 20 are formed on the substrate 11. As illustrated in FIG. 16B, the lower electrode 33a is formed on the metal pattern 20. The dielectric layer 31*a* is formed on the substrate 11 by using a CVD (Chemical Vapor Deposition) method, for example, so as to cover the transistor 60, the metal pattern 20 and the lower electrode 33*a*. The upper electrode 32*a* is formed on the dielectric layer 31*a*. As illustrated in FIG. 16C, the dielectric layer 31*a* on the upper surface of the transistor 60 is removed by, for example, etching. The lower surface of the substrate 11 is polished or ground to reduce the thickness of the substrate 11. The via hole 22 penetrating through the substrate 11 is formed. The metal layers 28 and 28*a* are formed on the lower surface of the substrate 11 and the inner surface of the via hole 22. Thus, the semiconductor chip 10*b* of the fourth embodiment is formed.

Figure 17:
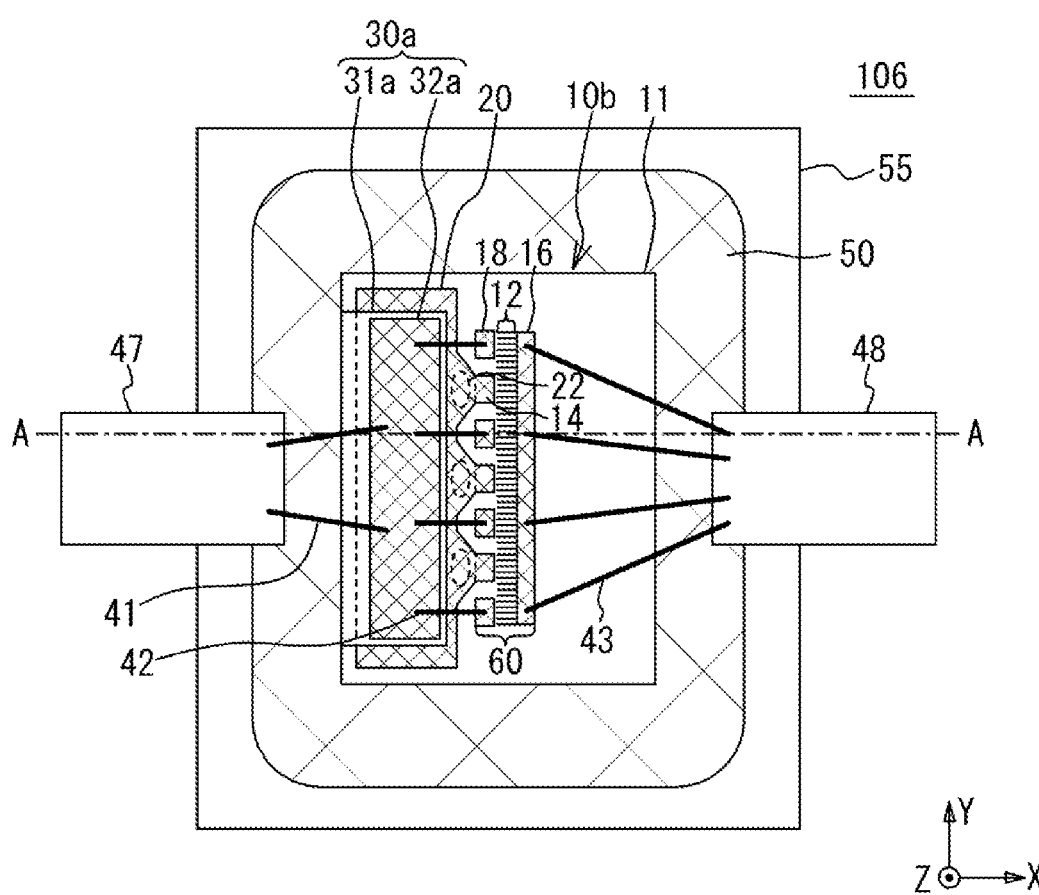
FIG. 17 is a plan view of a semiconductor device according to the fourth embodiment.
Figure 18:
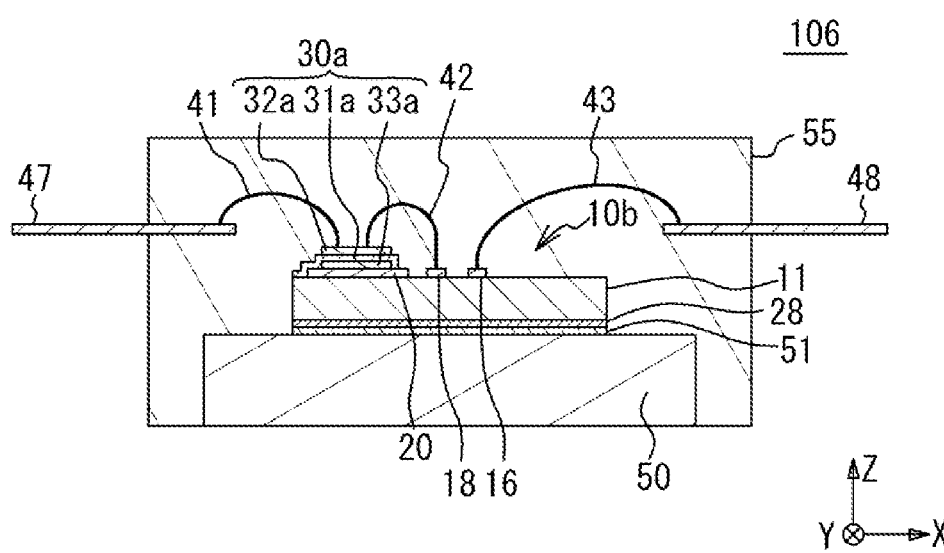
FIG. 18 is a cross-sectional view taken along line A-A of FIG. 17.

FIG. 17 is a plan view of a semiconductor device according to the fourth embodiment. FIG. 18 is a cross-sectional view taken along the line A-A of FIG. 17. FIG. 17 illustrates the upper surface of the base 50 as seen through the sealing resin 55. As illustrated in FIGS. 17 and 18, in a semiconductor device 106 of the fourth embodiment, the semiconductor chip 10*b* illustrated in FIGS. 14 and 15 is mounted on the base 50. Other configurations of the fourth embodiment are the same as those of the third embodiment, and description thereof is omitted.

As in the fourth embodiment, the capacitor 30*a* may be provided on the semiconductor chip 10*b*. That is, the lower electrode 33*a* (first lower electrode) is in contact with the metal pattern 20. The dielectric layer 31*a* (first dielectric layer) may be provided from a region of the upper surface of the metal pattern 20 where the lower electrode 33*a* is not provided to a region between the lower electrode 33*a* and the upper electrode 32*a* (first upper electrode). Thus, the process of mounting the capacitor 30 on the semiconductor chip 10*b* as in the first embodiment can be reduced.

As a package for sealing the semiconductor chip 10*b*, the frame and the lid as in the first embodiment may be used instead of the sealing resin 55. Instead of the capacitor 34 having a ceramic substrate or a semiconductor substrate as the dielectric layer 35 as in the second embodiment, a capacitor formed on the substrate 11 by using a semiconductor process such as the capacitor 30*a* may be provided on the semiconductor chip 10*b*.

In the first to fourth embodiments, the FET is used as the transistor 60, but the transistor 60 may be a bipolar transistor other than the FET. When the transistor 60 is the FET, the input electrode is the gate electrodes 18, the output electrode is the drain electrode 16, and the reference potential electrode is the source electrodes 14, the inductance of the inductor L2 of the matching circuit 62 is reduced, and the bonding wires 42 are shortened. Therefore, the capacitors 30 and 30*a* connected to the gate electrodes 18 are provided on the metal pattern 20.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:
a semiconductor chip including:
a substrate;
a transistor provided on an upper surface of the substrate and having an input electrode to which a high frequency signal is input, an output electrode from which the high frequency signal is output, and a reference potential electrode to which a reference potential is supplied; and
a metal pattern provided on the upper surface of the substrate and electrically connected to the reference potential electrode;
a first capacitor including:
a first lower electrode provided on the metal pattern and electrically connected to the metal pattern,
a first dielectric layer provided on the first lower electrode, and
a first upper electrode provided on the first dielectric layer;
a first bonding wire electrically connecting the first upper electrode and a first electrode which is any one of the input electrode and the output electrode;
a conductive base on which the semiconductor chip is mounted and to which the reference potential is supplied;
a second capacitor provided on a region of the base other than another region where the semiconductor chip is mounted and including a second lower electrode electrically connected to the conductive base, a second dielectric layer provided on the second lower electrode, and a second upper electrode provided on the second dielectric layer; and
a second bonding wire electrically connecting the second upper electrode and a second electrode other than the first electrode of the input electrode and the output electrode.

2. The semiconductor device according to claim 1, wherein
the first lower electrode is connected on the metal pattern by using a brazing filler metal.

3. The semiconductor device according to claim 1, wherein
the first dielectric layer is a ceramic substrate or a semiconductor substrate.

4. The semiconductor device according to claim 1, wherein
the first lower electrode is in contact with the metal pattern, and the first dielectric layer is provided from a region of an upper surface of the metal pattern where the first lower electrode is not provided to another region between the first lower electrode and the first upper electrode.

5. The semiconductor device according to claim 1, further comprising:
a first signal terminal; and
a third bonding wire electrically connecting the first upper electrode and the first signal terminal.

6. The semiconductor device according to claim 1, further comprising:
a second signal terminal; and
a fourth bonding wire electrically connecting the second upper electrode and the second signal terminal.

7. The semiconductor device according to claim 1, wherein
the first electrode is the input electrode, and the second bonding wire is longer than the first bonding wire.

8. The semiconductor device according to claim 1, further comprising:
wherein the metal pattern and the reference potential electrode are electrically connected to the conductive base via a via hole penetrating through the substrate.

* * * * *